United States Patent [19]

Chang

[11] Patent Number: 4,531,044

[45] Date of Patent: Jul. 23, 1985

[54] METHOD OF LASER SOLDERING

[75] Inventor: Dale U. Chang, West Bloomfield, Mich.

[73] Assignee: Ford Motor Company, Dearborn, Mich.

[21] Appl. No.: 474,650

[22] Filed: Jan. 24, 1983

[51] Int. Cl.³ .................. B23K 15/00; H01C 1/14; H01C 1/144

[52] U.S. Cl. ................. 219/121 LM; 219/121 LC; 219/121 LD; 219/121 L; 219/121 EC; 219/121 ED; 338/329

[58] Field of Search ..... 219/121 LM, 121 L, 121 LE, 219/121 LD, 121 LC, 121 LT, 85 BA, 85 BM, 121 EC, 121 ED; 338/322, 329

[56] References Cited

U.S. PATENT DOCUMENTS

| | | | |
|---|---|---|---|
| 3,294,951 | 12/1966 | Olson | 219/121 EA X |
| 3,520,055 | 7/1970 | Jannett | 219/121 EC X |
| 3,614,832 | 10/1971 | Chance et al. | 219/121 LR X |
| 4,278,867 | 7/1981 | Tan | 219/121 LC X |
| 4,320,281 | 3/1982 | Cruickshank et al. | 219/121 LD |
| 4,327,277 | 4/1982 | Daly | 219/121 LT X |
| 4,341,942 | 7/1982 | Chaudhari et al. | 219/121 LD |
| 4,404,453 | 9/1983 | Gotman | 219/121 LD |

FOREIGN PATENT DOCUMENTS

| | | | |
|---|---|---|---|
| 19186 | 11/1980 | European Pat. Off. | 219/121 LM |
| 2735231 | 2/1979 | Fed. Rep. of Germany | 338/121 LM |
| 57-17369 | 1/1982 | Japan | 219/85 BA |

OTHER PUBLICATIONS

Thwaites et al., "Soldering Techniques & Equipment", *Electronics Manufacturing*, vol. 15, No. 3, Mar./Apr. 1969, pp. 21-29.
Saunders et al., "Lasers, Operation, Equipment, Applications and Design", McGraw-Hill Books Co., ©1980, pp. 78-82.

*Primary Examiner*—Roy N. Envall, Jr.
*Assistant Examiner*—C. N. Sears
*Attorney, Agent, or Firm*—Joseph W. Malleck; Olin B. Johnson

[57] ABSTRACT

A method of soldering electrical lead strands (of a width at least 0.3 inch) to a printed electrical path is disclosed. The path is planted on an alumina ceramic substrate and a solder pad is attached to a portion of the path. A flat surface portion of each lead strand is forced into full interengagement with a pad, a $CO_2$ defocused laser beam is directed onto the soldering assembly with the beam controlled to have a beam power of at least 100 watts, a beam spot diameter no less than the width of the lead strand and no greater than the width of the pad, and a beam on-time effective to exert a controlled thermal radius on the soldering assembly to reflow only a preselected portion of the pad and effect a solder joint between the pad and strand portion, the joint having a strength of at least 400 grams. The parameters of the beam power, beam spot diameter, and beam on-time are optimally correlated by the following equation:

$$c = \frac{a}{\sqrt{2}} \left( \ln \frac{2 P.A.R (1 - \exp(-t_c/RC))}{\pi a^2 \cdot T_m} \right)^{\frac{1}{2}}$$

where: C is the critical thermal radius, a is the Gaussian radius at $1/e^2$, ln is logarithm, $T_m$ is the melting temperature of the solder minus the specimen temperature, P is the laser beam power in watts, A is the surface absorptivity of the solder at 10.6 microns, R is the terminal resistance per unit area of the system, $t_c$ is the critical time to bring the solder to the $T_m$ temperature, c is the heat capacity of the system.

21 Claims, 9 Drawing Figures

EFFECT OF PREHEAT TEMPERATURE ON POWER REQUIREMENT

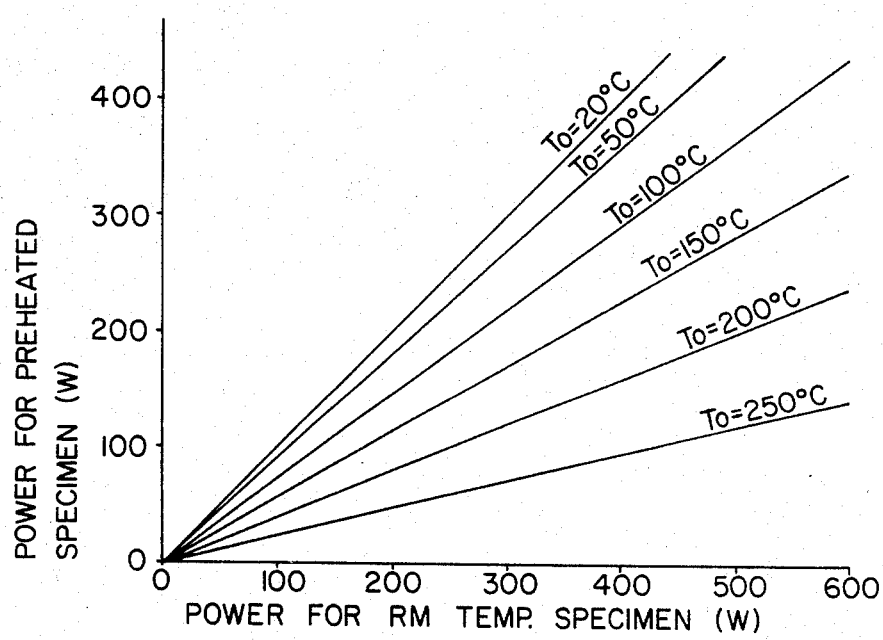
FIG. 8 EFFECT OF PREHEAT TEMPERATURE ON POWER REQUIREMENT

METHOD OF LASER SOLDERING

BACKGROUND OF THE INVENTION AND PRIOR ART STATEMENT

Laser soldering has been carried out to date in what is essentially an early stage, a stage directed to proving feasibility. It has demonstrated utility over mechanical soldering techniques because it can reach inaccessible soldering assemblies, such as those recessed in a housing. These early attempts have been applied to the assembly of small electronic components mounted on conventional plastic (epoxy fiberglass impregnated) boards, which prevented heat conduction to the rest of the assembly. Very small diameter wires of conventional construction were soldered using relatively small solder pads dabbed onto easily accessible conductors of a circuit. These early feasibility attempts used very small powered laser beams (7–50 watts) and focused the beams on the solder pad to microsized diameters (0.005–0.010 inch) in order to effect melting. These early feasibility attempts are referenced in the following:

(1) F. Burns and C. Zyetz, "Laser Micro Soldering", Apollo Lasers, Inc. Report.
(2) E. R. Goodrich, "Lasers in Electronics", Circuits Manufacturing, Vol. 21, No. 7, July 1981.
(3) R. Saunders et al, "Lasers-Operation, Equipment, Application, and Design", prepared by Engineering Staff of Coherent Inc., McGraw-Hill, 1980.
(4) T. Kujawa, "Laser Soldering Boosts Productivity", Lasers and Applications, September 1982.

Unfortunately, such early feasibility activities used processing techniques which would not enable an assembler to solder assemblies with the new emerging design constraints of automotive applications. For example, assemblies of sensitive electronic components may now employ larger sized electrical lead conductors (greater than 0.030 inch in width and in many cases flat or rectangular in cross section) which must be soldered with a higher strength to withstand varying thermal expansion forces experienced in the engine compartment of a road vehicle. The prior usage of low powered, neatly focused laser beams provided several obstacles to effective soldering of such emerging design assemblies. The laser beam, so controlled to a microsized diameter, would not melt a sufficient amount of the solder pad to effect a reflowed fillet along the entire bottom surface of a large, flat electrical lead wire, resulting in a weak joint. Reflowing solder about a small, round wire is considerably easier due to surface tension about a round surface. If the interfacing diameter of the laser beam were to be modified or expanded, the beam energy/unit surface area would not be sufficient to melt the solder and effect the reflowed joint.

In some of the emerging automotive electronic units to be soldered (such as an electronic ignition module mounted in an engine compartment) the solderable joints are supported on ceramic substrates used to conduct heat away during normal vehicle operation of the module, thereby preventing destruction of the printed circuit and soldered joints due to momentary high currents. However, such ceramic substrates act as a heat sink and facilitate rapid run-off of heat during soldering which inhibits proper thermal control of the laser diameter, and certainly makes it impossible to use low powered laser beams if proper soldering is to be effected. Increasing the laser beam power by itself is not an answer to this dilemma because a high powered beam, focused at a desired diameter, will heat the solder excessively, leaving little room for processing error and resulting in damage to adjacent sensitive electronic parts.

What is needed is a method of laser soldering which permits recessed soldering assemblies, supported on ceramic substrates, and employing larger sized conductors, to be effectively soldered with increasingly stronger joints and soldered within a wide range of processing parameters making the process easily usable by manufacturing personnel without tight limits.

SUMMARY OF THE INVENTION

The invention is a method of soldering one or more electrical lead strands to a printed electrical path. The method comprises the steps of: (a) planting the path on a ceramic substrate and attaching at least one solder pad to a portion of the printed electrical path; (b) forcing a surface portion of the electrical lead strand into full interengagement with the pad with an engaging force sufficient to permit heat conduction therebetween for soldering, the pad having a width greater than the width of the surface portion of the electrical lead strand, and the interengaging surface portion of the electrical lead strand having a width greater than 0.03 inch, the portion of the electrical lead strand and pad constituting a soldering assembly; and (c) directing a defocused laser beam onto the soldering assembly, the beam having a beam power of at least 100 watts, a beam spot diameter no less than the width of the electrical lead strand and no greater than the width of the pad, and a beam on-time effective to exert a controlled thermal radius on the soldering assembly to reflow only a preselected portion of the pad and effect a solder joint between the pad and the strand portion, the joint having a strength of at least 400 grams.

It is preferable that the electrical lead strand have a flat interengaging surface and the pad have a mating, generally flat interengaging surface (allowing for a slight radius due to surface tension). It is advantageous if the laser beam is defocused by an amount of 0.4 inch (with a five inch focal length lens) and have a focal point located above the soldering assembly to thereby protect against reflection of the laser beam to other sensitive electronic components. It is also desirable that the center of mass of the interengaging surface of the electrical lead strand be aligned with the center of the pad against which it is forced.

It is advantageous if the thermal radius is increased by at least one of the following: (a) a coating of energy absorbing paint, or (b) by increasing the temperature of the soldering assembly by preheating to a temperature of at least 100° C. It is further advantageous if the laser beam spot diameter is controlled within the dimensional limits of 0.03–0.09 inch and that the beam on-time be limited to 50–2000 milliseconds (0.05–2.0 seconds). The beam parameters can be optimized by use of the following mathematical relationship:

$$c = \frac{a}{\sqrt{2}} \ln \left[ \frac{2P \cdot A \cdot R(1 - \exp(-t_c/RC))}{\pi a^2 \cdot T_m} \right]^{\frac{1}{2}}$$

where:
c is the critical thermal radius (melt radius)
a is the Gaussian radius at $1/e^2$ point ln is logarithm $T_m$ is the melting temperature of the solder minus the specimen preheat temperature P is the laser beam power in watts A is the surface absorptivity of the solder at 10.6 microns R is the thermal resistance per unit area of the system $t_c$ is the critical time to bring the solder to the $T_m$ temperature (beam on-time is approximately $t_c/0.975$)

C is the heat capacity of the system.

It is advantageous if a shielding gas is used during soldering to prevent the flux from burning for easy removal of the flux after soldering.

It is preferable that the ceramic, supporting the electrical path, be selected as one or both from the group consisting of alumina and beryllia, and advantageously have a film thickness of at least 0.02 inch.

It is advantageous if the electrical lead strands extend from an annular integral lead frame which is encapsulated within an annular nonconductive housing. The leads may be preferably comprised of a tin coated brass material, the pad comprised of a tin/lead/silver or tin/lead alloy, and the printed circuit be comprised of palladium/silver material. A flux is typically employed between the pad and strand and is preferably comprised of nonactivated rosin. It is also preferable that the laser beam be a $CO_2$ generated laser.

SUMMARY OF THE DRAWINGS

FIG. 6 is a schematic diagram illustrating a Gaussian energy beam distribution across the solder pad.

DETAILED DESCRIPTION

Figure 1:
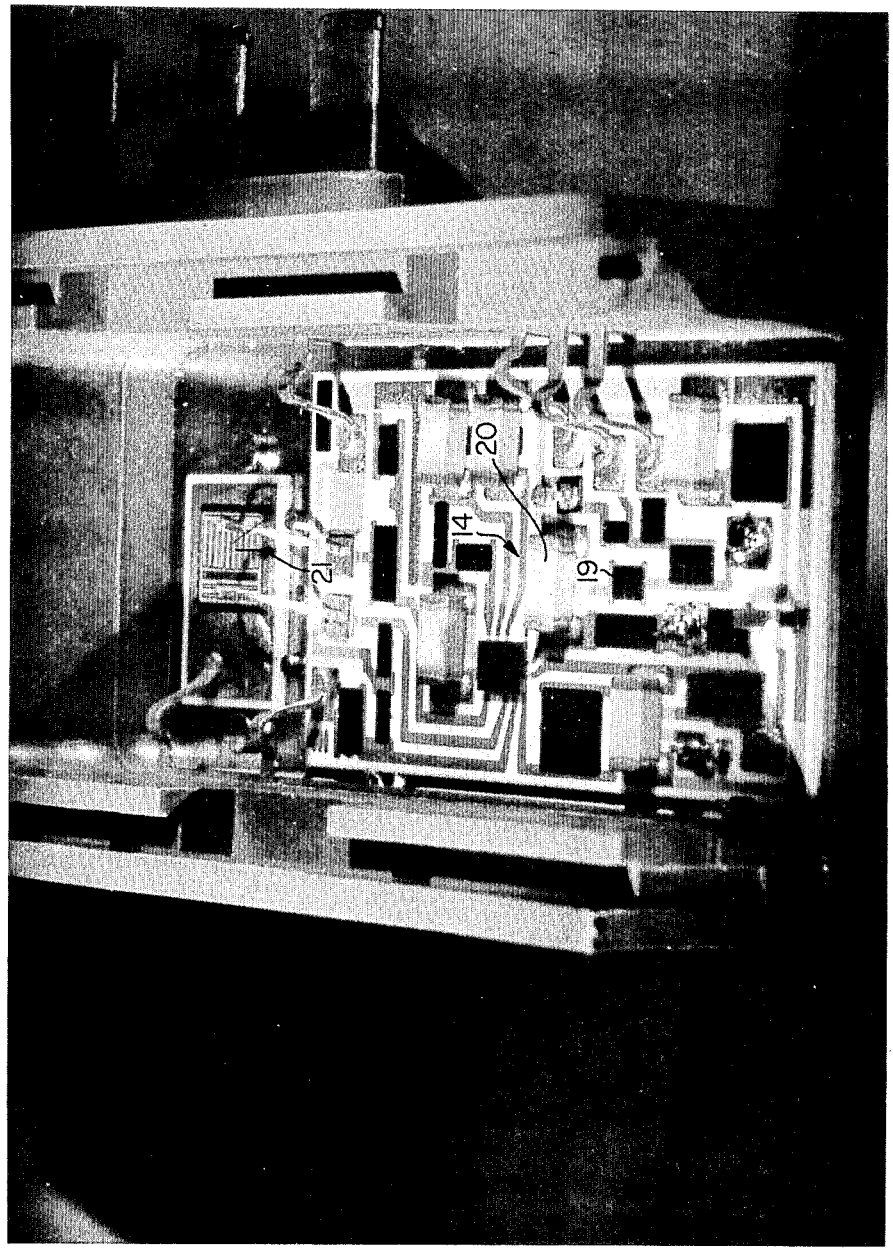
FIG. 1 is a photograph illustrating a microelectronic device having several joints soldered by the method of this invention.

As a preferred mode, the invention is applied to the soldering of integral electrical leads to a thick film ignition module useful in controlling the starting of an internal combustion engine. The device to be soldered is more particularly shown in FIGS. 1 and 3, and more completely disclosed in copending U.S. Pat. No. 4,470,648, "Interconnection Construction to Thick Flow Substrate", invented by D. Davis and C. Henritzy, assigned to the assignee of this invention.

Essentially, the microelectronic device 10 comprises an annular lead frame 11 which is encapsulated or buried within a plastic annular housing 12 with integral lead strands 13 projecting inwardly through the sides of the housing and depending downwardly therefrom. This device here has nine electrical lead strands projecting inwardly that need to be soldered to a printed electrical circuit 14 supported on a ceramic substrate 15 and recessed below the top opening of the housing. One of the substrate materials is alumina and occupies 75% of the total substrate; the other is beryllia. The ceramics are glued to a supporting aluminum plate 16 which acts as a heat sink.

Each of the electrical lead strands is comprised of a brass conductive strip nominally comprised of 70% copper and 30% zinc. The projecting portion of the lead strand is given an inverted U-shape 17 with the terminal portion defining a foot 18 to be soldered to a portion 14a of the printed circuit 14. The foot of the electrical strand has a flat cross sectional configuration here sized to be 0.04 inch wide and 0.009 inch thick. Numerous adjacent sensitive electronic components are present such as resistors 19, capacitors 20, and electronic chip 21.

A ceramic substrate is required in this device because of the necessity for maintaining a heat sink during operation of the ignition module for engine starting. Ceramic has a higher conductivity than a plastic (epoxy fiberglass-impregnated) substrate, typically used by the prior art. The alumina is nominally comprised of 94% $Al_2O_3$ and used in a thickness about 0.02 inch (0.56 millimeters); the beryllia substrate is nominally comprised of 99.5% minimum BeO and in a thickness of about 0.02 inch. The aluminum supporting plate 16 is comprised of AA3003H14 aluminum alloy and used in a thickness of about 0.06 inch.

The electrical lead strands are of a size much greater than that normally employed by the prior art, having a width 22 greater than 0.03 inch, and have a flat, rectangular cross section (i.e., 0.04 inch × 0.009 inch). Such electrical lead strands require different processing technology to ensure that a completely solid solder joint takes place throughout the entire interface (under-surface) of the electrical lead foot as well as around the edges thereof.

The method herein comprises essentially three steps:

1. A printed electrical circuit path 14 is planted on a ceramic substrate 15 and at least one solder pad 24 is attached to a portion 14a of the printed electrical path. The solder pad may be deposited by conventional techniques which normally include silk screening. The pad here is a soldering composition comprised of 10% tin, 88% lead, and 2% silver. The pad is formed to have a generally flat interfacing surface 25 (except for curvature due to surface tension) with a width greater than the width of the electrical lead. Here, each of the pads have a rectangular configuration of 0.08 inch wide, 0.1 inch long, and 0.006 inch high.

Figure 2:
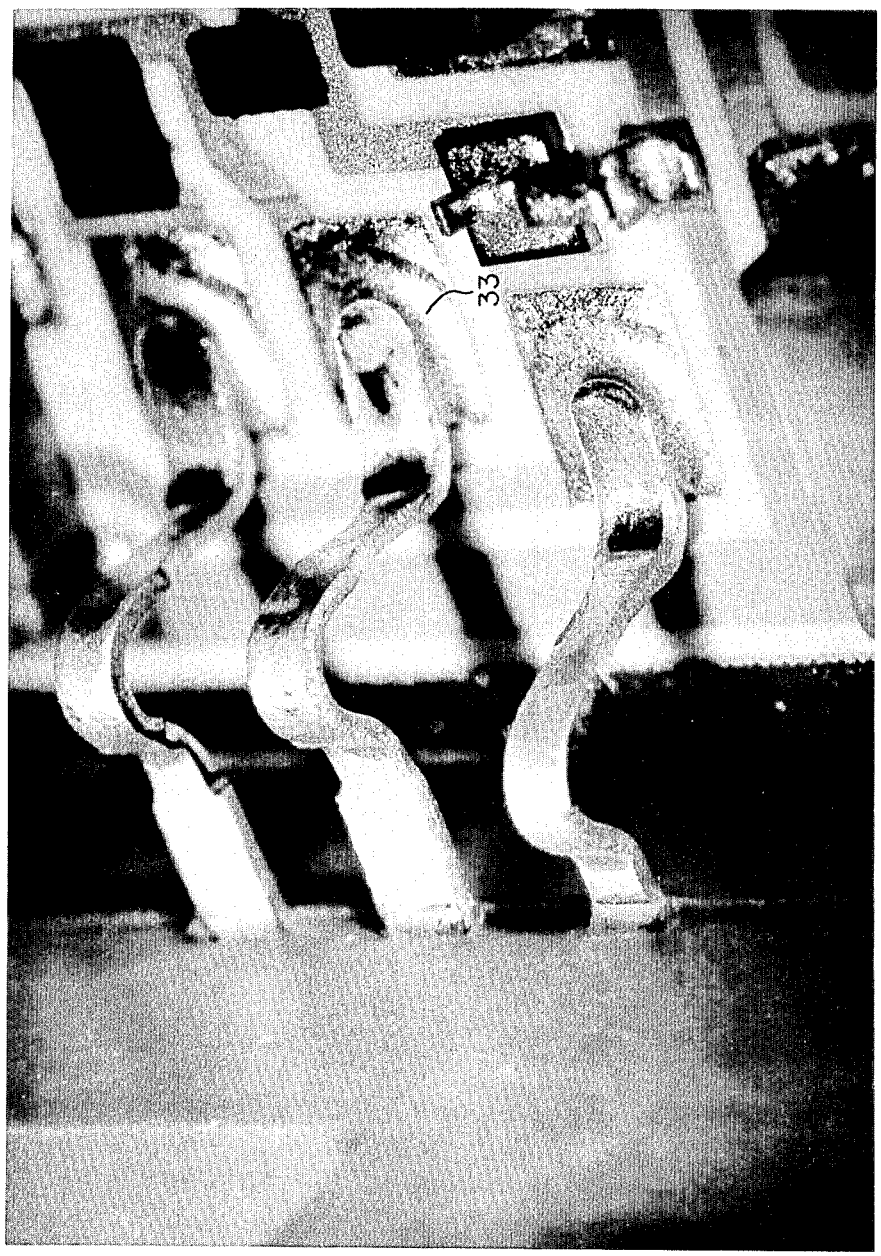
FIG. 2 is an enlarged photograph illustrating some of the electrical leads of FIG. 1 successfully soldered in accordance with the present invention.
Figure 3:
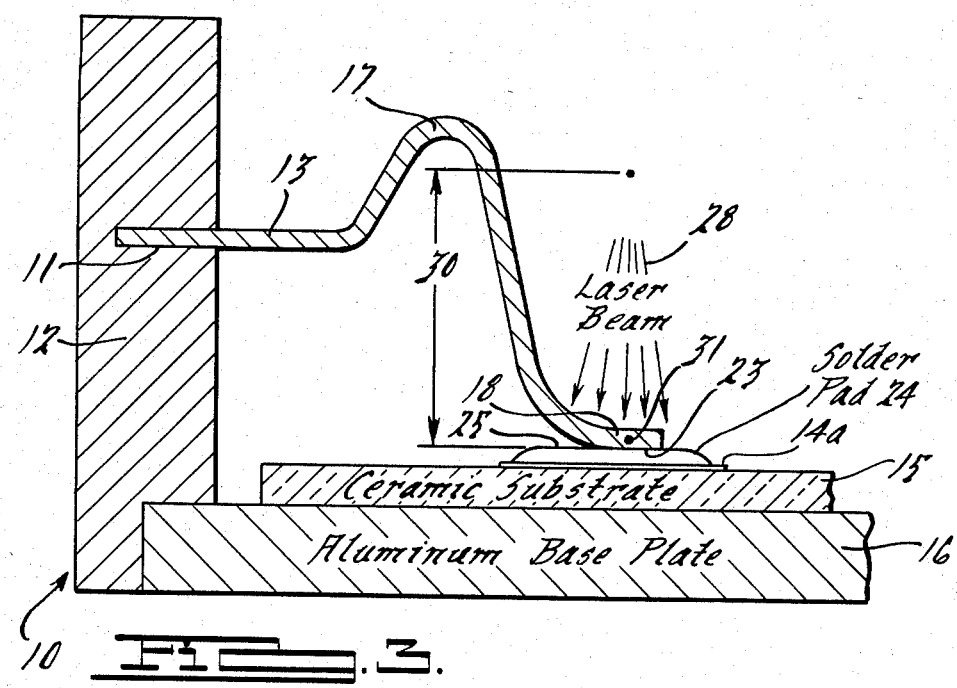
FIG. 3 is a schematic sectional elevational view of a portion of the device of FIG. 1 showing one soldered joint and an insert (FIG. 3a) illustrating a plan view of the soldering joint.

2. The surface portion 23 of the electrical lead is forced into full interengagement with the soldering pad (against surface 25) with an engaging force of 50–150 grams. It is important that the pad 24 have a width 26 greater than the width 72 of the electrical strand and the interengaging surface portion of the electrical lead have a width 22 greater than 0.03 inch. To bring about the imposition of force by the electrical lead strand on the pad, the electrical lead strand is bent with a radius or U-shape as shown in FIGS. 2 and 3; this allows the strand to impart a spring bias against the top surface 25 of the pad. The end of the pad has a curved foot 18 portion to permit mating of the interengaging flat surfaces 23-25.

3. A defocused laser beam is directed onto the soldering assembly, the beam having a beam power of at least 100 watts, a beam spot diameter 27 which is no less than the width 22 of the electrical strand and no greater than the pad width 26, as well as a beam on-time effective to exert a controlled thermal radius on the soldering assembly to reflow only a preselected portion of the soldering pad and effect a soldered joint between the pad and the electrical strand portion, the joint having a strength of at least 400 grams.

The laser beam 28 employed here was generated by a 370 watt $CO_2$ laser apparatus and was focused at a point 29 a distance 30 (0.4 inch) above the soldering assembly. The beam impinged downwardly on the foot 18 and solder pad 24 assembly. The central axis of the laser beam was aligned with the center of mass 31 of the electrical lead at its engaging portion and also aligned with the center 32 of the soldering pad. A small amount of soldering flux was applied to the area between the soldering surfaces prior to soldering, such flux being typically nonactivated rosin microflux.

The soldering assembly was preheated to 150° C. to lower the power requirement and to eliminate the possibility of thermal shock. A coaxial nitrogen gas stream was used to (a) shield the solder area from oxidation and thereby protect the soldering joint from a black coating deposition, and (b) to protect the focusing lens from being fogged by smoke. The beam itself, as it emanated from the generating device, had a diameter of about 0.6 inch, and was defocused slightly above the soldering assembly to have a spot diameter on the soldering assembly of 0.030-0.080 inch. The best results were obtained when the spot diameter was 0.050-0.060 inch.

Figure 4:
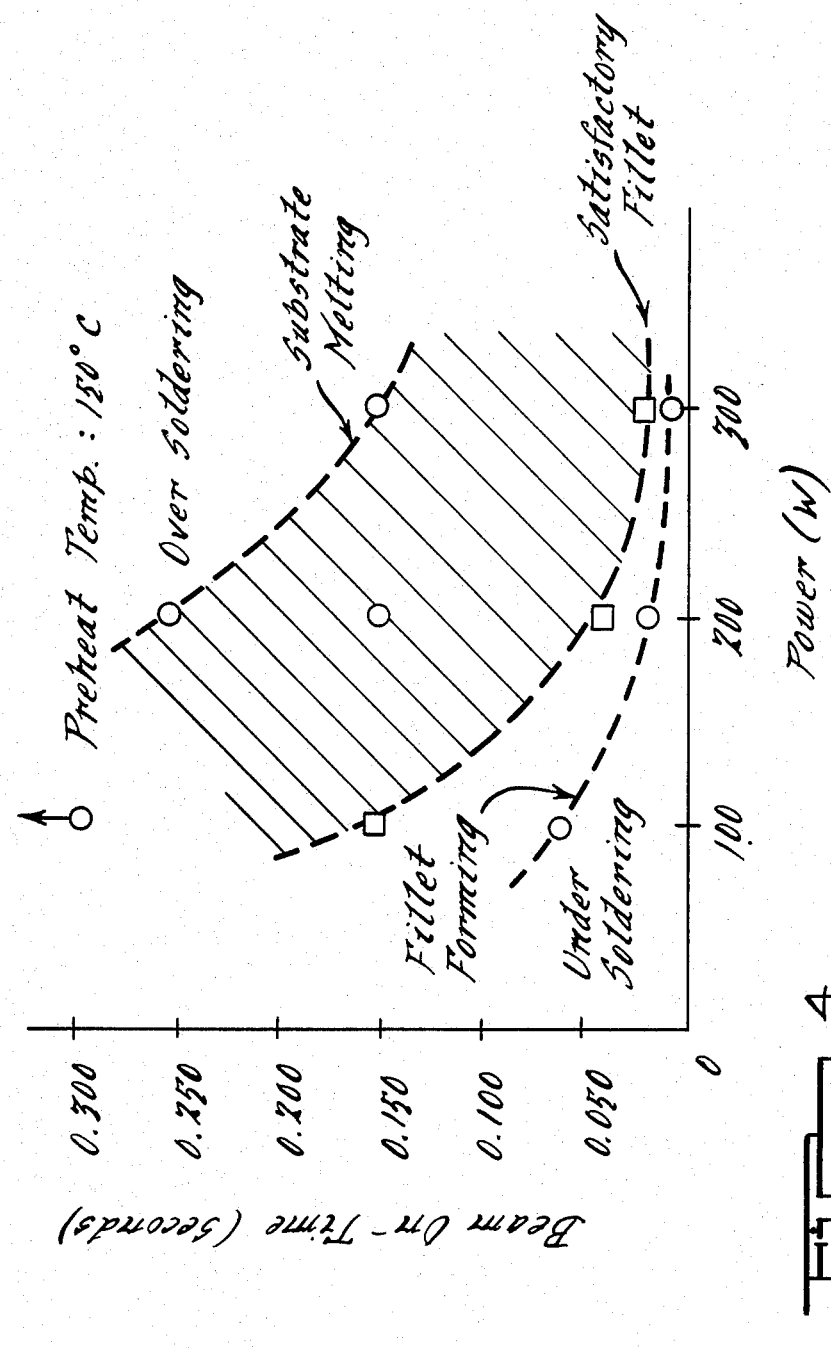
FIG. 4 is a graphical illustration depicting the variation of beam on-time with beam power at various combinations (the cross hatched portion showing the acceptable manufacturing combinations that are useful).

Various soldering operations were undertaken with a variation of beam power and time to see whether satisfactory soldered joints of sufficient strength could be effected. It was found that soldered joints with a strength of 2000 grams or greater could be effected with a power variation of at least 100 watts and up to 500 watts, a beam on-time of 50-500 milliseconds (0.005-0.25 seconds). These combinations of beam power and beam on-time that worked using large sized electrical leads and soldering pads are plotted in FIG. 4 (spot diameter in this case is 0.060 inch). The shaded area of FIG. 4 represents the manufacturing window wherein tolerable combinations of parameters can be employed to render a satisfactory fillet 33 around the entire joint (see FIG. 2) without permitting the entire solder pad to melt nor the substrate to melt.

Figure 8:
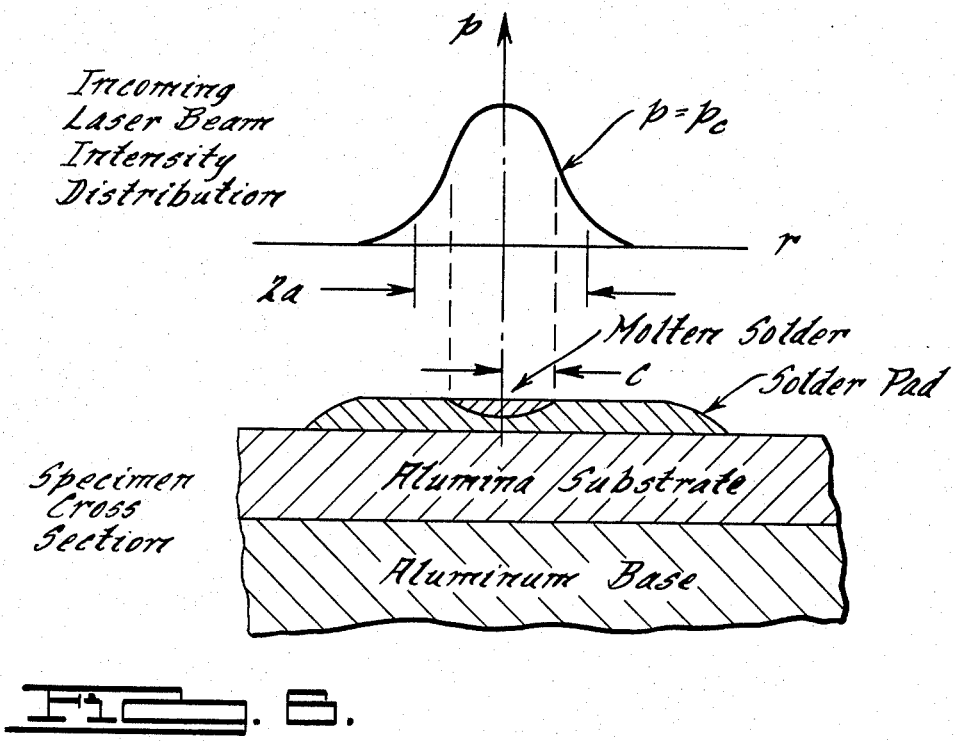
FIG. 8 is a graphical illustration of beam power as a function of soldering assembly temperature at various preheat temperatures $T_o$.
Figure 3A:
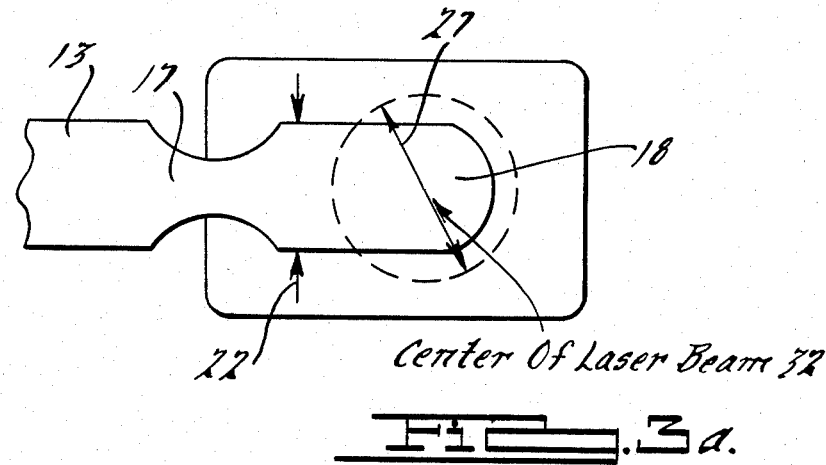

Room temperature specimens which were not preheated required a longer beam on-time or a higher power level than preheated specimens. A room temperature specimen required 50-75% more power than a specimen preheated to 150° C. for the same beam on-time. Accordingly, it is preferred that a preheat temperature of the soldering assembly be employed which is at least 100° C. At this temperature, the power may be reduced by 25% compared to the room temperature (20° C.) specimen (see FIG. 8).

The energy requirement or power level of the laser beam can be decreased by increasing the surface absorptivity of the soldering lead. The power level can be reduced, for example, from 400 watts to 200 watts, by applying a black coating on the lead foot or by eliminating the nitrogen gas shielding.

The effect of the beam spot on beam on-time is such that the minimum time for satisfactory fillet formation is progressively decreased as the beam spot diameter is increased. The widest time range for satisfactory joints was obtained when the beam spot diameter was about 0.05 inch (1.27 millimeters). An excessively large spot diameter (such as 0.085 inch) coupled with a long beam on-time (such as 0.3 seconds) sometimes caused a beam reflection problem; such reflection causes heat damage to the adjacent components such as resistors or capacitors. The reflection problem, can be reduced by use of a proper defocused beam (proper spot diameter) with the focal point above the soldering assembly. The shielding gas flow increases the power requirement; but without a shielding gas, a black residue is left by the burned flux. Since the black residue cannot be removed easily, it is recommended that the shielding gas be employed. A gentle blow of the nitrogen gas is adequate to prevent the flux from burning or charring.

CRITICAL THERMAL RADIUS

The beam spot diameter has been used as a common measure in laser thermal processing to define the beam size on the work piece. However, this diameter by itself cannot be used in predicting the amount of thermal work accomplished. For example, in the drilling of holes with laser beams in various materials, such as glass, the drilled hole is consistently different from the beam spot diameter on the glass material.

The critical thermal radius of this invention is the radius of an area on the work piece within which the desired thermal effect is achieved. It represents the radius of the melt area in laser soldering.

To obtain a mathematical relationship that will provide an accurate critical thermal radius, an analysis of input heat distribution is necessary. A simple thermal model of one-dimensional heating and a Gaussian beam profile were assumed in the analysis. When a laser beam impinges on a metallic absorbing surface, the laser light is absorbed by interaction with electrons. A quantum of optical energy is absorbed by an electron which in turn dissipates its energy by colliding with lattice phonons and other electrons. Since the mean free time between the collision of electrons is on the order of $10^{-12}$ to $10^{-13}$ seconds, one may consider that the optical energy is almost instantaneously turned into heat. The penetration depth of the light field in a good conductor, such as used in the preferred mode of this invention, lies in the range of $10^{-6}$ centimeters or 10-100 atomic layers. Thus, laser absorption is considered to occur at the surface in cases of laser soldering.

Figure 5:
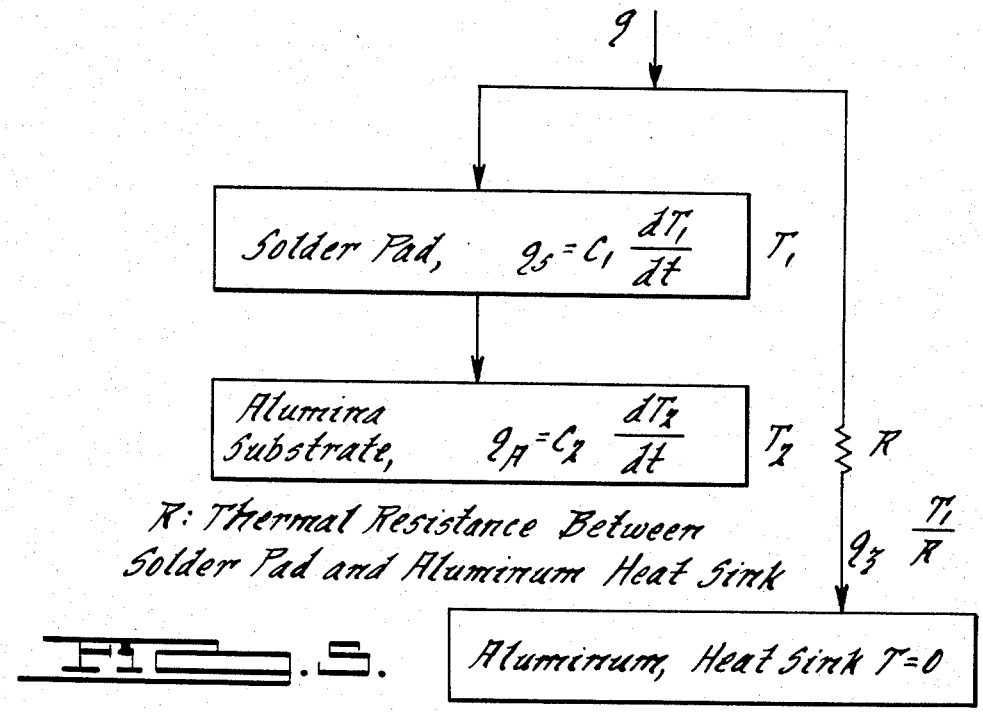
FIG. 5 is a heat flow diagram between the various materials forming the soldering assembly of FIG. 2.

A few other additional assumptions were adopted to simplify the heat flow analysis of the system: (a) the thermal properties of the materials and the thermal resistance were assumed not to change with temperature, (b) the convection and the radiation losses were considered negligible, (c) the heat flow was considered one-dimensional, (d) the solder pad was at a uniform temperature throughout the thickness, and (e) the aluminum base was considered the heat sink. With these assumptions, and as shown in FIG. 5, the heat flow system can be proportioned with heat flow into two components: accummulated heat and conducted heat. The heat input q is partially accummulated in the solder pad ($q_s$) and the alumina substrate ($q_A$), and the rest of the heat is conducted away to the heat sink $q_3$ (aluminum plate). As shown in FIG. 5, $T_2$ is the average temperature of the alumina substrate through the thickness and, if one assumes a parabolic temperature profile within the alumina substrate, the average temperature of the substrate $T_2$ is given by the relationship $T_2$ is equal to $T_1/3$. The energy balance of the heat flow system in FIG. 6 yields a first order differential equation:

$$q = q_s + q_A + q_3$$

$$q = \left(C_1 + \frac{C_2}{3}\right) \frac{dT_1}{dt} + \frac{T_1}{R}$$

where:
$C_1$ = heat capacity of the solder pad
$C_2$ = heat capacity of the ceramic substrate.

From this we can solve for $T_1$ and, if we define a further quantity called $q_c$ as the rate of heat flow per unit area to bring the solder temperature from $T_1$ to $T_m$ in $T_c$ seconds, we have the expression:

$$q_c = \frac{T_m}{R\left[1 - \exp\left(\frac{-t_c}{RC}\right)\right]}$$

After the solder reaches $T_m$, additional energy is needed to melt the solder, and this additional energy can be supplied by an extended beam on-time approximately 3% longer than the time $t_c$ shown above.

The radius of a Gaussian beam is typically defined as the radius at which the intensity falls to $1/e^2$ of its peaked value (86.5% of the total beam energy is contained within the area of this radius). The intensity profile of a Gaussian beam is illustrated in FIG. 6. When a Gaussian beam melts a spot of radius c on the solder pad, as shown in FIG. 6, the beam intensity at the edge of the melt spot is given by the following equation:

$$P_c = \frac{2P}{\pi a^2} \exp\left[-2\frac{\gamma}{a}2\right]$$

This radius c is selected as the critical thermal radius because it defines the area where the desired thermal effect is achieved. Employing previous equations, the c radius (critical thermal radius) can now be reduced to the following mathematical relationship:

$$c = \frac{a}{\sqrt{2}} \left( \ln \frac{2P.A.R(1 - \exp(-t_c/RC))}{\pi a^2 \cdot T_m} \right)^{\frac{1}{2}}$$

where:
c is the critical thermal radius
a is the Gaussian radius at $1/e^2$ point
ln is logarithm
$T_m$ is the melting temperature of the solder minus the specimen temperature
P is the laser beam power
A is the surface absorptivity of the solder at 10.6 microns
R is thermal resistance per unit area of the system
$t_c$ is the critical time to bring solder to $T_m$
C is the heat capacity of the system.

The minimum power to melt the solder at a given time ($T_1$) can be obtained by setting c=0 in the previous equation.

Figure 7:
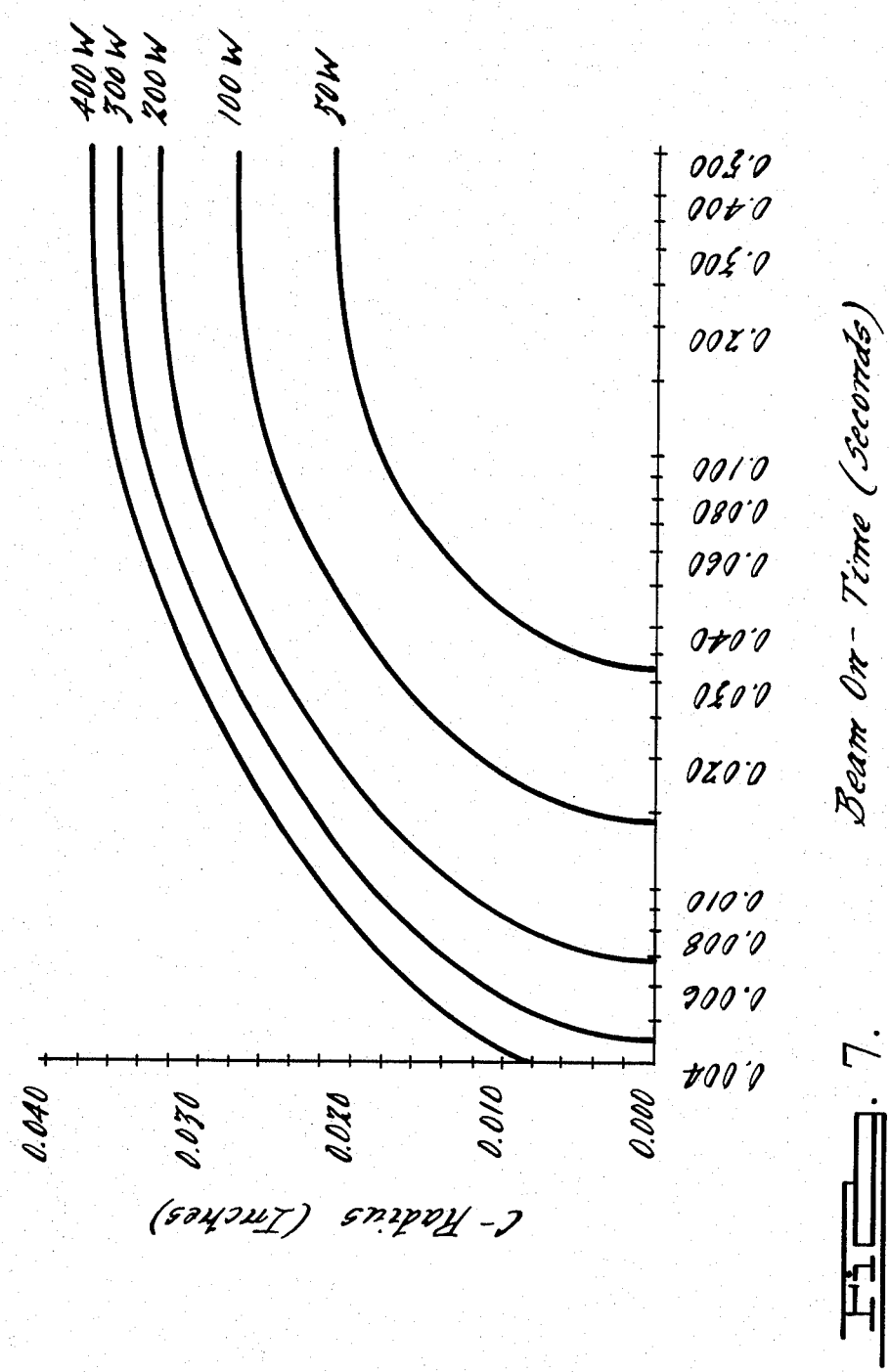
FIG. 7 is a graphical illustration of critical thermal radius varying as a function of beam on-time at various power levels.

FIG. 7 shows the theoretical c radius as a function of beam on-time when the beam spot diameter is 0.060 inch. The plot was generated by substituting proper values of the parameters and material properties into the critical thermal radius equation.

I claim:
1. A method of soldering one or more electrical lead strands to a printed electrical path, comprising the steps of:
   (a) planting said path on a ceramic substrate and attaching at least one solder pad to a portion of said printed electrical path;
   (b) forcing a surface portion of said electrical lead strand into full interengagement with said pad with an engaging force sufficient to permit heat conduction therebetween for soldering, said portion of said electrical lead strand and pad constituting a soldering assembly;
   (c) directing a defocused laser beam onto said soldering assembly, and a beam-on time effective to exert a controlled thermal radius on said soldering assembly to reflow only a preselected portion of said pad and effect a solder joint between said pad and said strand portion, said joint having a strength of at least 400 grams;
   (d) the parameters of beam power, beam spot diameter, and beam on time-are optimally correlated by the following equation:

$$c = \frac{a}{\sqrt{2}} \left( \ln \frac{2P.A.R(1 - \exp(-t_c/RC))}{\pi a^2 \cdot T_m} \right)^{\frac{1}{2}}$$

the critical thermal radius a is the Gaussian radius at $1/e^2$, ln is logarithm, Tm is the melting temperature of the solder minus the specimen temperature, P is the laser beam power it watts, A is the surface absorptivity of the solder at 10.6 microns, R is the thermal resistance per unit area of the system, tc is the ciritical time to bring the solder to the Tm temperature, c is the heat capacity of the system.

2. The method as in claim 1, in which said electrical lead strand has a flat interengaging surface and said pad has a mating, generally flat interengaging surface.

3. The method as in claim 1, in which said laser beam is defocused to 0.03–0.08 inch diameter, in step (c), so that the focal point of said beam is away from the plane of interengagement by a distance of 0.2–0.8 inch for a five inch focal length lens.

4. The method as in claim 3, in which said laser beam is focused at a point above the interengaging plane of said soldering assembly.

5. The method as in claim 1, in which said thermal radius is increased by coating of at least a portion of said soldering assembly with an energy absorbing material.

6. The method as in claim 1, in which the ceramic substrate of step (a) is selected as one or both from the group consisting of alumina and beryllia, said ceramic having a thickness of at least 0.05 inch.

7. The method as in claim 1, in which the beam spot diameter employed in step (c) is in the range of 0.03–0.08 inch.

8. The method as in claim 1, in which the center of mass of said surface portion of the electrical lead strand is aligned with the center of said pad during interengagement.

9. The method as in claim 1, in which the electrical lead strand is comprised of tin or solder coated brass, the pad is comprised of a tin/lead/silver or tin/lead alloy, and the printed circuit is comprised of a palladium/silver composition.

10. The method as in claim 1, in which said thermal radius is effective to melt the portion of said pad providing a surrounding fillet between said surface portion of the electrical lead and the pad.

11. A method of soldering one or more electrical lead strands, extending from an annular integral leadframe encapsulated within an annular nonconductive housing, to a printed electrical path carried on a ceramic substrate recessed within said housing, the method comprising:
  (a) planting at least one solder pad in engagement with a portion of said printed electrical path;
  (b) bringing a portion of said electrical lead strand into continuous engagement with said pad with a force of 50-150 grams while aligning the mass of said portion of said electrical strand with the center of said pad, said portion of the electrical strand and pad constituting a soldering assembly;
  (c) wetting said assembly with a flux and, while shrouding said soldering assembly in a shielding flow of nitrogen gas, directing a defocused laser beam, having a beam diameter of 0.03-0.08 inch at the interface of said beam and solder pad, onto said soldering assembly, said beam having a power and beam on-time effective to exert a critical thermal radius on said soldering assembly to reflow a portion of said pad and effect a sound solder joint between said pad and strand portion, said critical thermal radius being computed by the equation:

$$c = \frac{a}{\sqrt{2}} \left( \ln \frac{2P.A.R(1 - \exp(-t_c/RC))}{\pi a^2 \cdot T_m} \right)^{\frac{1}{2}}$$

where:
c is the critical thermal radius
a is the Gaussian radius at $1/e^2$ point
ln is logarithm
$T_m$ is the melting temperature of solder minus the specimen temperature
P is the laser beam power in watts
A is the surface absorptivity of the solder at 10.6 microns
R is thermal resistance per unit area of system
$t_c$ is critical time to bring solder to $T_m$
C is the heat capacity of the system.

12. The method as in claim 11, in which said critical thermal radius ranges from a minimum of one-half the diameter of the electrical strand portion and to a maximum of one-half the width of the solder pad.

13. The method as in claim 11, in which said ceramic substrate is selected from the group consisting of alumina and beryllia.

14. The method as in claim 11, in which said substrate is a ceramic film having a thickness of about 0.02 inch.

15. The method as in claim 11, in which said electrical lead strand consists of a tin-coated or solder-coated brass strip with a flat, rectangular cross section.

16. The method as in claim 11, in which said solder pad has a generally rectangular configuration with a thickness of about 0.006 inch.

17. The method as in claim 11, in which prior to directing said laser beam said assembly is wetted with a fluxing agent and said assembly is shrouded in a shielding flow of nitrogen gas.

18. The method as in claim 11, in which said electrical lead strand is painted with an energy absorption material.

19. The method as in claim 11, in which said solder pad consists of an alloy of tin-lead-silver.

20. The method as in claim 11, in which said printed electrical path is comprised of a palladium/silver alloy.

21. The method as in claim 11, in which said solder joint between said pad and strand portion has a joint strength of at least 400 grams.

* * * * *